(12) United States Patent
Chen et al.

(10) Patent No.: US 7,099,156 B2
(45) Date of Patent: Aug. 29, 2006

(54) LOCKING DEVICE FOR HEAT DISSIPATING DEVICE

(75) Inventors: Chun-Chi Chen, Tu-Cheng (TW); Shi-Wen Zhou, Shenzhen (CN); Hsieh-Kun Lee, Tu-Cheng (TW)

(73) Assignee: Hon Hai Precision Industry Co. Ltd., (TW)

( * ) Notice: Subject to any disclaimer, the term of this patent is extended or adjusted under 35 U.S.C. 154(b) by 161 days.

(21) Appl. No.: 10/930,550

(22) Filed: Aug. 31, 2004

(65) Prior Publication Data

US 2005/0201064 A1    Sep. 15, 2005

(30) Foreign Application Priority Data

Mar. 10, 2004    (CN)    ........................ 2004200436135

(51) Int. Cl.
*H05K 7/20* (2006.01)
*A41F 1/00* (2006.01)

(52) U.S. Cl. ...................... 361/719; 361/704; 257/718; 165/80.3; 24/453; 24/458

(58) Field of Classification Search ................ 361/704, 361/719; 257/718; 165/80.3, 185; 24/453, 24/458

See application file for complete search history.

(56) References Cited

U.S. PATENT DOCUMENTS

| | | | | |
|---|---|---|---|---|
| 4,927,287 A | * | 5/1990 | Ohkawa et al. | 403/408.1 |
| 5,943,210 A | * | 8/1999 | Lee et al. | 361/697 |
| 6,104,614 A | * | 8/2000 | Chou et al. | 361/704 |
| 6,301,113 B1 | * | 10/2001 | Guerrero | 361/704 |
| 6,412,546 B1 | * | 7/2002 | Lin et al. | 165/80.3 |
| 6,498,724 B1 | * | 12/2002 | Chien | 361/687 |
| 6,791,838 B1 | * | 9/2004 | Hung et al. | 361/704 |
| 6,795,317 B1 | * | 9/2004 | Liu | 361/704 |
| 6,859,367 B1 | * | 2/2005 | Davison | 361/704 |

* cited by examiner

*Primary Examiner*—Boris Chérvinsky
(74) *Attorney, Agent, or Firm*—Morris Manning & Martin; Tim Tingkang Xia, Esq.

(57) ABSTRACT

A locking device for mounting a heat sink to a CPU mounted on a printed circuit board, includes a first locking member extending the heat sink and the circuit board and having a block for pressing the heat sink, an operating member pivotably connected to the first locking member, a second locking member extending the heat sink and the circuit board and pivotably connected to the operating member, and an actuating structure formed between the first and second locking members. The first and second locking members each includes a hook located below the circuit board. The operating member is pivotable about the first locking member to drive the second locking member to move upwardly and to cause the actuating structure to simultaneously drive the first and second locking members to move away from each other, whereby the hooks engage below the circuit board.

20 Claims, 6 Drawing Sheets

LOCKING DEVICE FOR HEAT DISSIPATING DEVICE

TECHNICAL FIELD

The present invention relates to a locking device, and particularly to a locking device which can conveniently mount a heat sink to an electronic component.

BACKGROUND

As computer technology continues to advance, electronic components such as central processing units (CPUs) of computers are made to provide faster operational speed and greater functional capabilities, which results in the CPU and other electronic components generating more and more heat. To ensure the CPU and other electronic components in the enclosure to function within their normal operating temperature ranges it is desirable to dissipate the generated heat quickly, for example, by using a heat sink attached to the CPU in the enclosure. Generally, a locking device is required for mounting the heat sink to the CPU and other electronic components.

FIG. 8 shows a conventional locking device for mounting a heat sink 200 to a CPU 600. The CPU 600 is mounted on a printed circiut board 500 which defines mounting holes 502 about the CPU 600. The heat sink 200 forms a pair of extension arms 202 each defining a through hole 204 corresponding to one of the mounting holes 502 of the printed circuit board 500. The locking device comprises a pair of push-pins 300 and a pair of springs 400. In assembly, the pins 300 extend sequentially through the respective springs 400, through holes 204 of the heat sink 200 and mounting holes 502. The bottom ends of the pins 300 are engaged with the printed circuit board 500 below the mounting holes 502. The springs 400 are compressed between the top ends of the pins 300 and the heat sink 200 to thereby exert downward force to the heat sink 200 to cause the heat sink 200 to intimately contact with the CPU 600.

However, in disassembly, it is difficult to detach the push-pins 300 from the printed circuit board 500. Furthermore, the springs 400 are prone to fatigue after a long time using. As a result, the heat sink 200 is not capable of intimately contacting with the CPU 600.

SUMMARY OF THE INVENTION

Accordingly, an object of the present invention is to provide a locking device which can firmly mount a heat sink to an electronic component and conveniently detach the heat sink from the electronic component.

To achieve the above-mentioned object, a locking device in accordance with a preferred embodiment of the present invention comprises a first locking member having a block for pressing on a heat sink, an operating member pivotably connected to the first locking member, a second locking member pivotably connected to the second locking member, and an actuating structure formed between the first and second locking members. The second locking member forms a hook for engaging below a circuit board on which the heat sink is mounted. The operating member is pivotable about the first locking member to drive the second locking member to move relative to the first locking member in a first direction which results in the actuating structure simultaneously driving the second locking member to move relative to the first locking member in a second direction which is perpendicular to the first direction, whereby the hook engage below the circuit board.

Other objects, advantages and novel features of the present invention will be drawn from the following detailed description of a preferred embodiment of the present invention with attached drawings, in which:

DETAILED DESCRIPTION OF A PREFERRED EMBODIMENT

Figure 1:
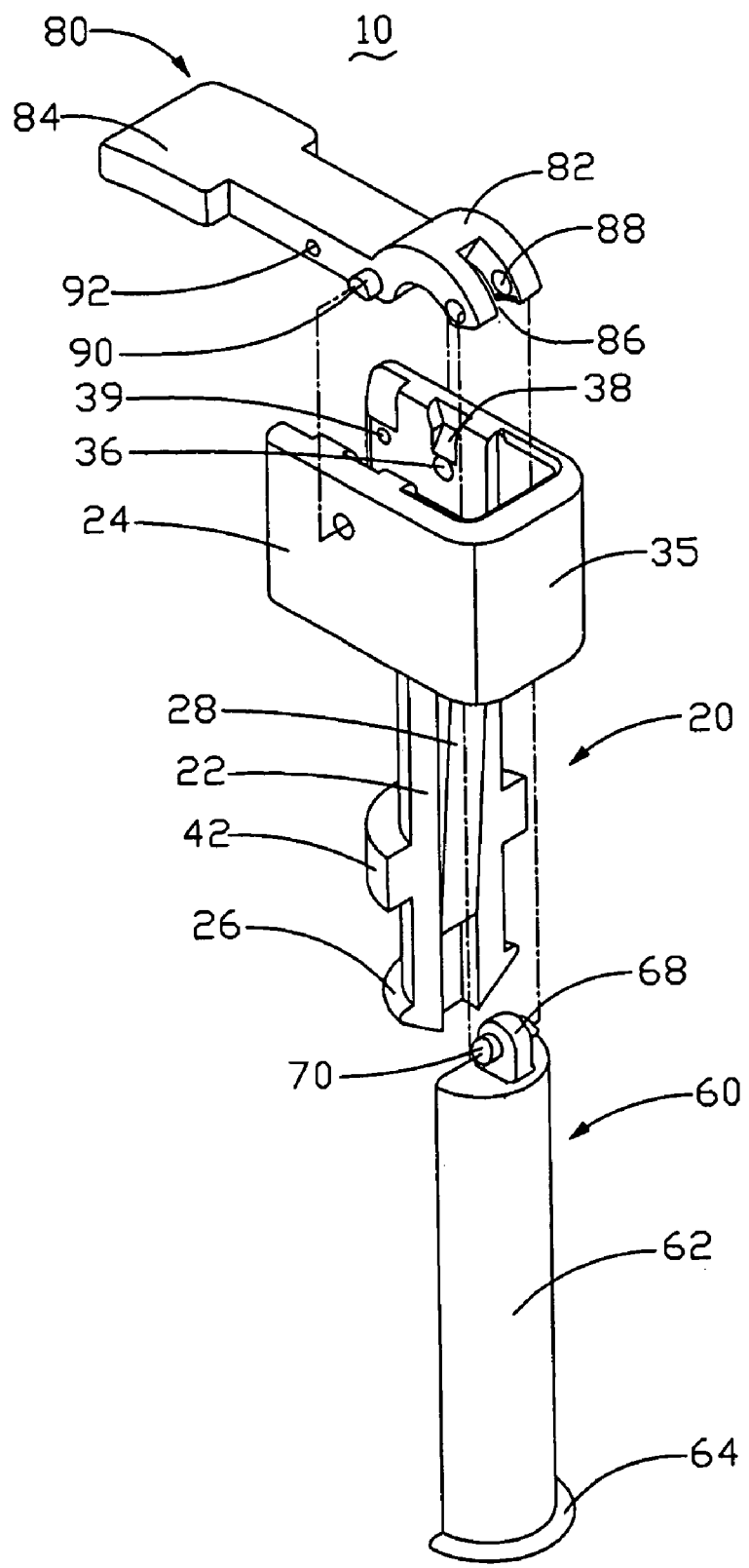
FIG. 1 is an exploded, isometric view of a locking device in accordance with a preferred embodiment of the present invention.
Figure 2:
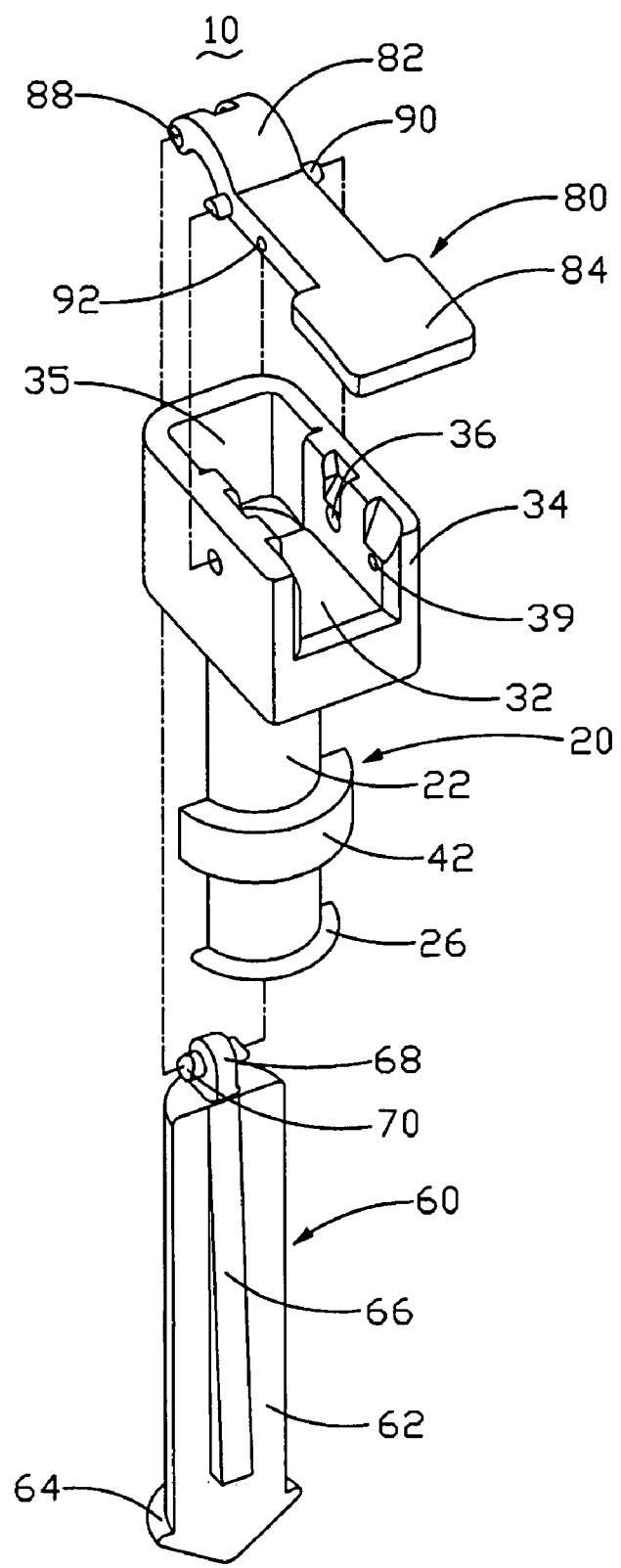
FIG. 2 is similar to FIG. 1, but viewed from another aspect.
Figure 3:
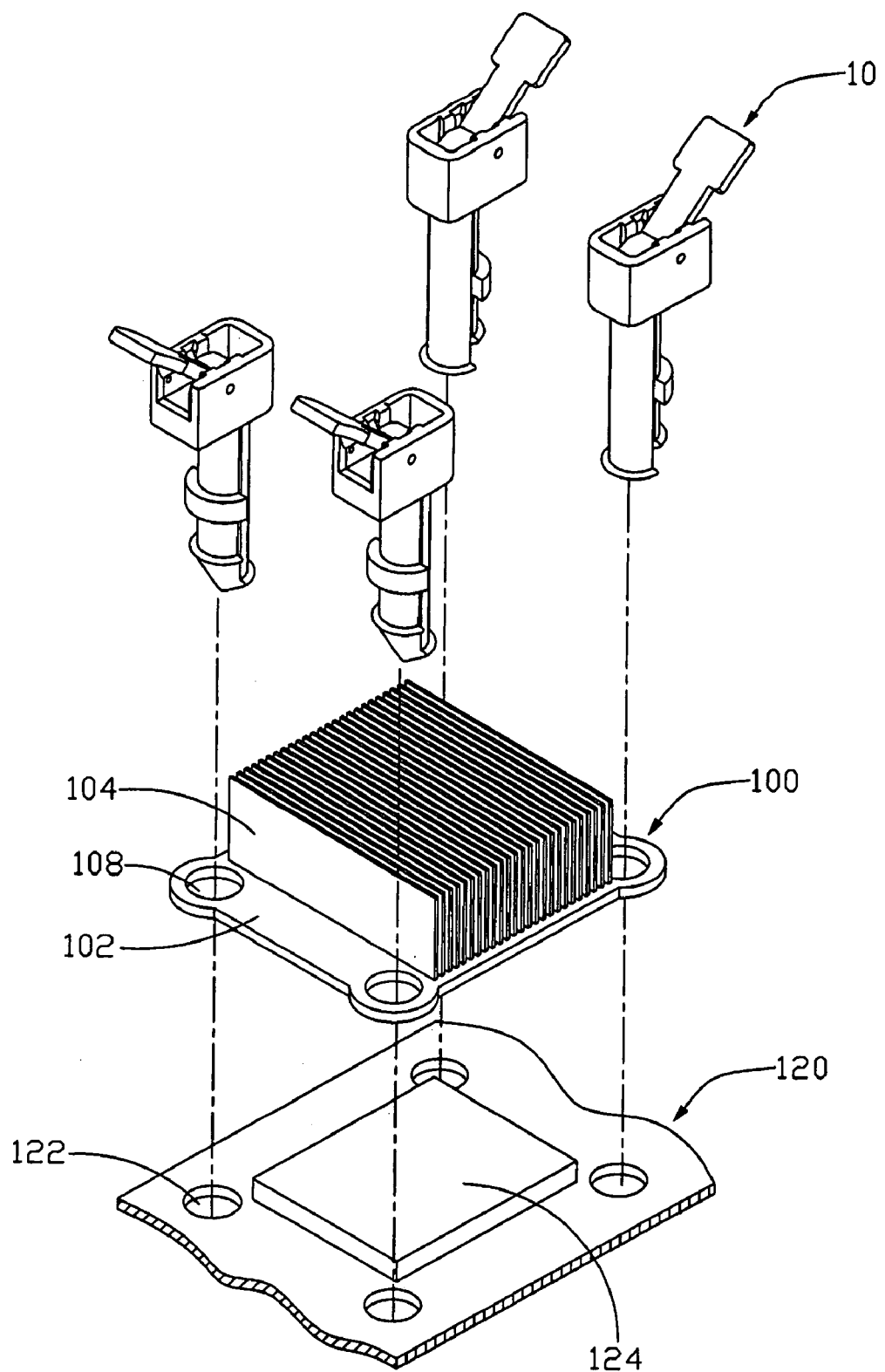
FIG. 3 is an exploded view of four locking devices of FIG. 1, a heat sink, and a printed circuit board.
Figure 4:
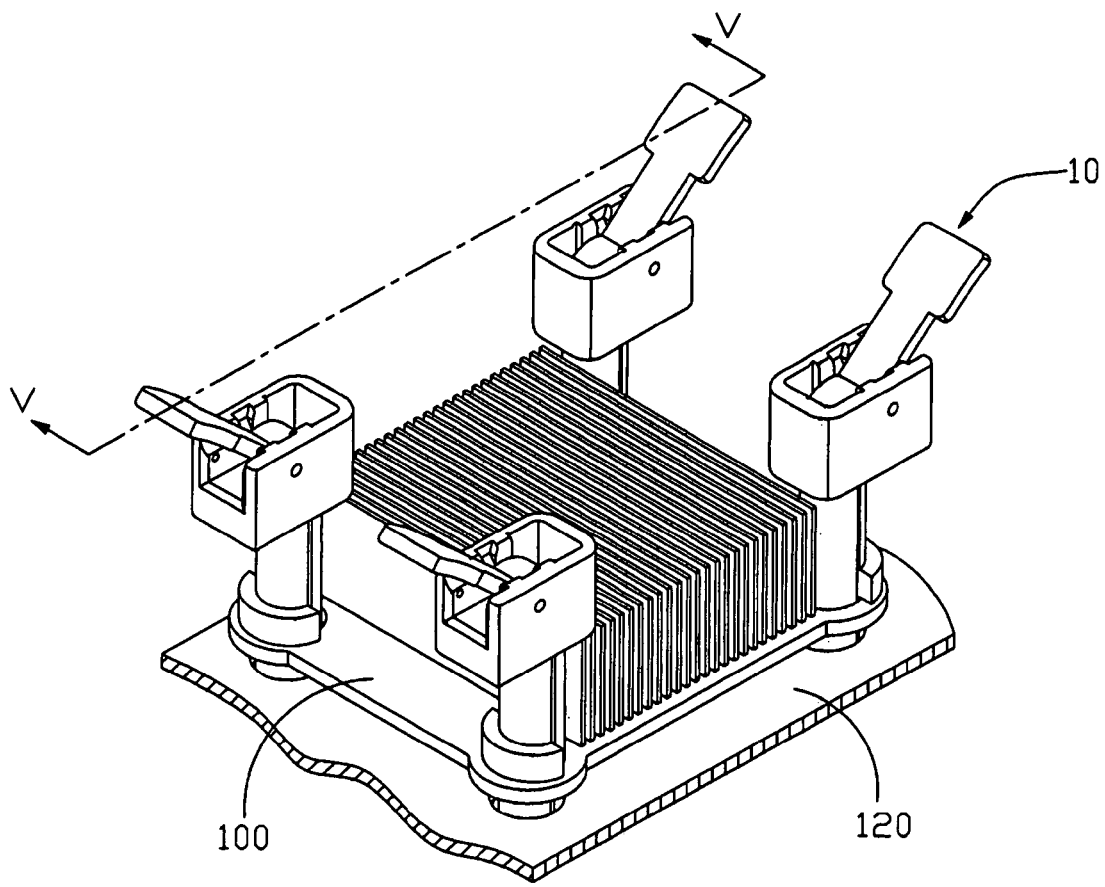
FIG. 4 is a partly assembled view of FIG. 3.
Figure 5:
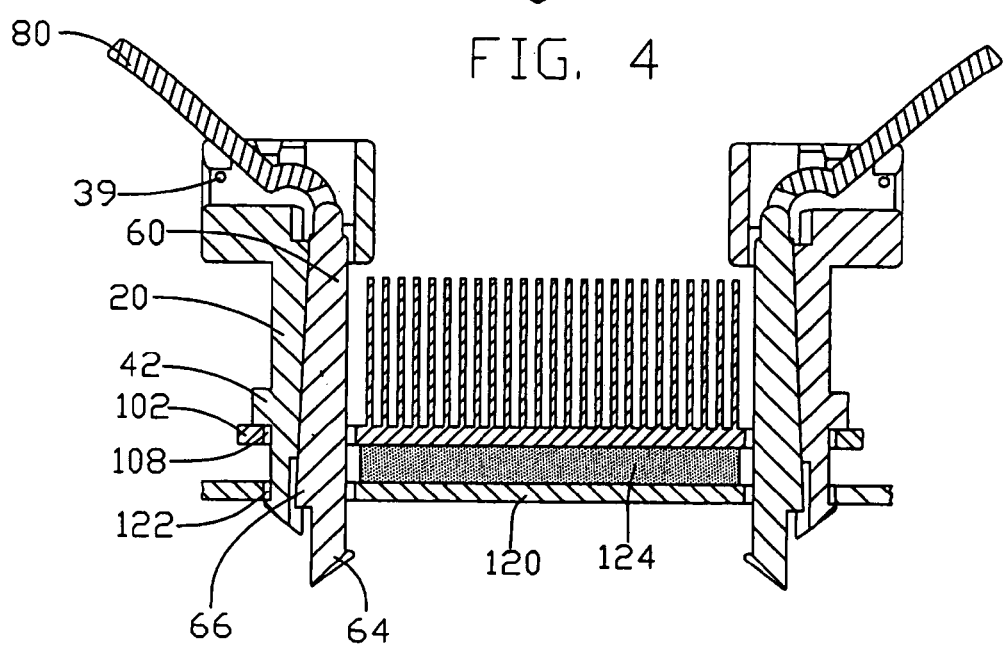
FIG. 5 is a cross-section view taken along line V—V of FIG. 4.
Figure 6:
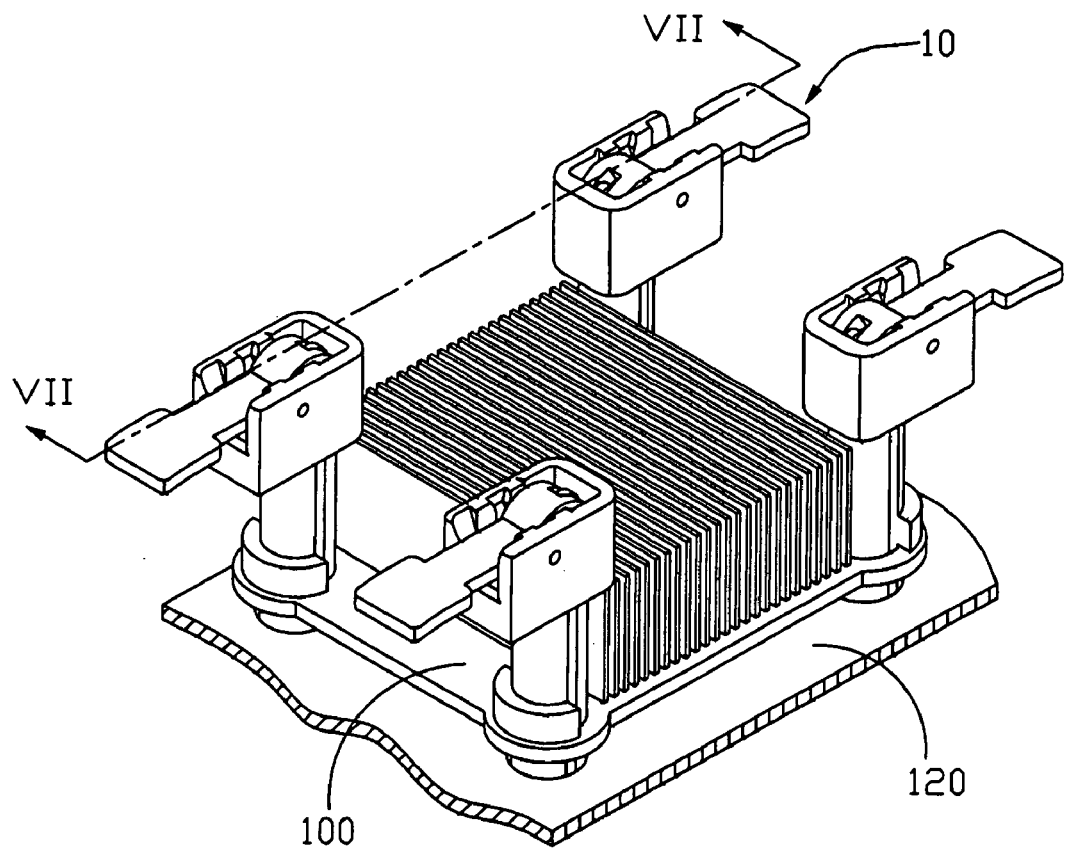
FIG. 6 is a completely assembled view of FIG. 3.
Figure 7:
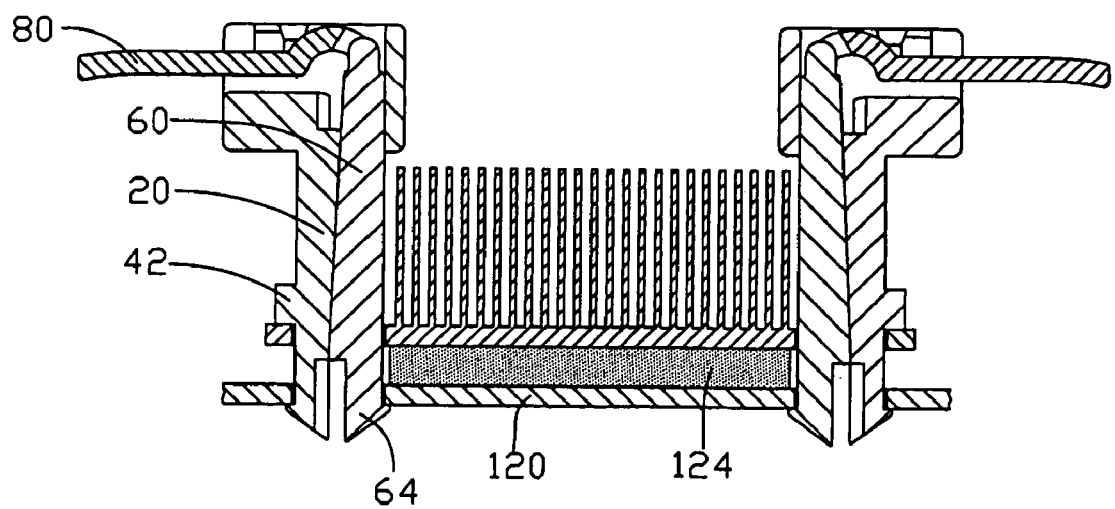
FIG. 7 is a cross-section view taken along line VII—VII of FIG. 6.
Figure 8:
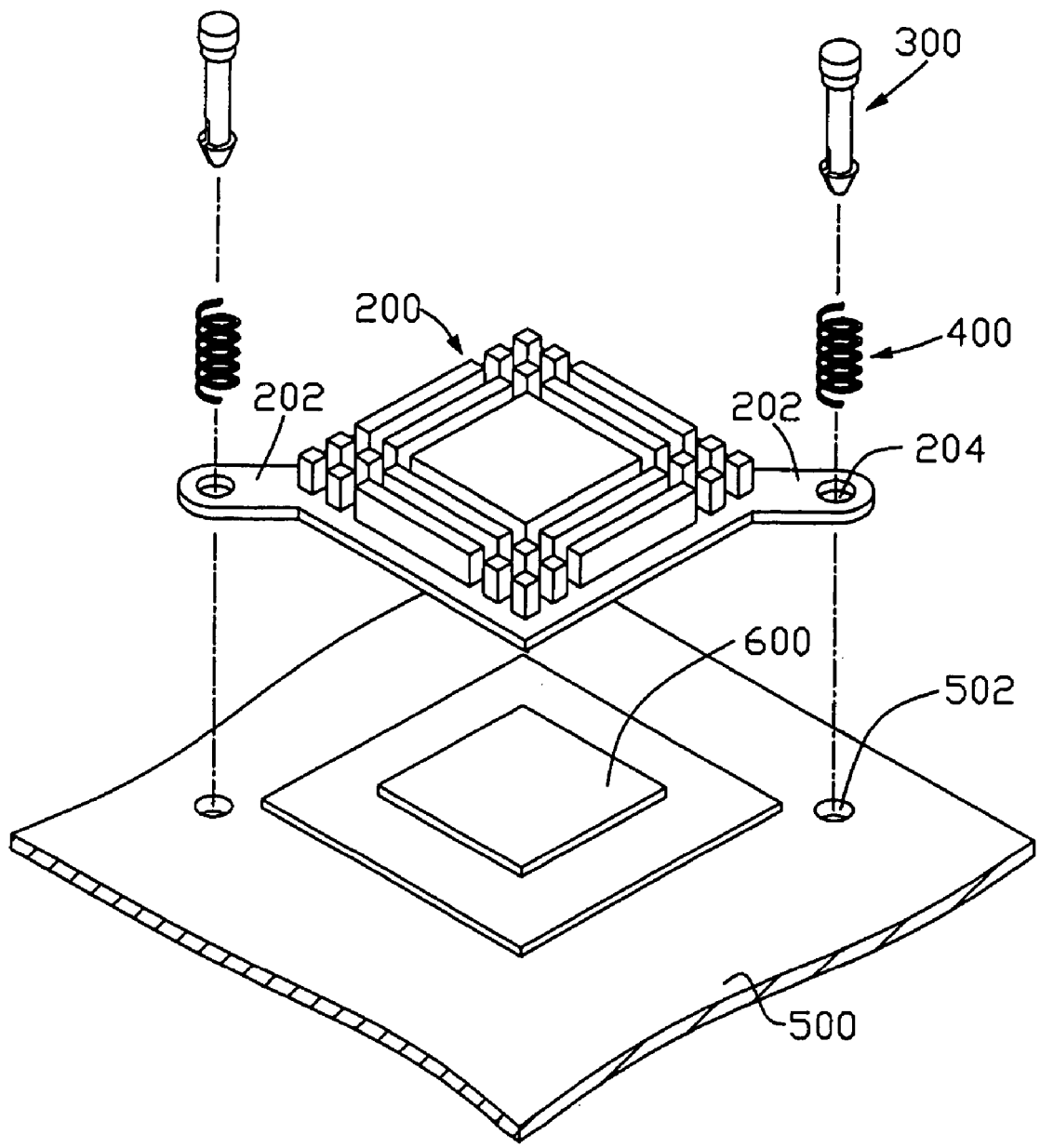
FIG. 8 shows a conventional locking device for mounting a heat sink to a CPU.

FIGS. 1–2 show a locking device 10 in accordance with a preferred embodiment of the present invention for mounting a heat sink 100 to a printed circuit board 120 (see FIG. 3).

The locking device 10 comprises a first locking member 20, a second locking member 60 and an operating member 80.

The first locking member 20 comprises a semi-cylindrical body 22, a head 24, a first hook 26 formed at the bottom of the body 22. The body 22 comprises a vertical planar face and a vertical circumferential face. A first wedge-shaped bar 28 is formed on the planar face of the body 22 in a longitudinal direction of the body 22. The thickness of the wedge-shaped bar 28 increases gradually from the first hook 26 to the head 24. A pressing block 42 is formed on the circumferential face of the body 22 adjacent to the first hook 26 so as to form a restriction mechanism. The head 24 comprises a bottom wall 32, a pair of side walls 34, and a connection wall 35 perpendicular to the bottom wall 32 and connected between the side walls 34. The bottom wall 32 defines an opening (not labeled). The side walls 34 cooperatively define a pair of coaxial holes 36. A pair of guiding inclined faces 38 is formed on the side walls 32 above the respective holes 36. A pair of retaining holes 39 is defined in the side walls 32 opposing the connection wall 35.

The second locking member 60 comprises a rod-shaped body 62, and a hook 64 formed at the bottom end of the body 62. The body 62 has a semi-circular cross section and comprises a vertical planar face and a vertical circumferential face. A second wedge-shaped bar 66 is formed on the planar face of the body 62 in a longitudinal direction of the body 62. The thickness of the second wedge-shaped bar 66 increases gradually in a direction from the top end of the body 62 to the bottom end of the body 62. A protrusion 68 is formed on the top end of the body 62. A pair of pivots 70 extends from opposite sides of the protrusion 68.

The operating member 80 comprises an arcuate connecting portion 82 and a handle 84 extending from one end of the connecting portion 82. The connecting portion 82 defines a cutout 86 in the opposite end thereof for receiving the protrusion 68 of the second locking member 60 which travels through the opening of the head 24 of the first locking member 20. A pair of pivot holes 88 is defined in the opposite end of the connecting portion 82 on opposite sides of the cutout 86 for receiving the pivots 70 of the second locking member 60 to thereby pivotably connect the second locking member 60 to the operating member 80. A pair of pivots 90 is formed on opposite sides of a junction between the connecting portion 82 and the handle 84 for being received in the holes 36 of the first locking member 20 to thereby pivotably connect the operating member 80 to the first locking member 20. A pair of projections 92 is formed on opposite sides of the handle 84.

Referring to FIG. 3, the heat sink 100 comprises a rectangular base 102 and a plurality of fins 104 extending from the base 102. The base 102 defines four through holes 108 as first receiving portions in four corners thereof. The printed circuit board 120 defines four through holes 122 as second receiving portions, corresponding to the through holes 108 of the heat sink 100. An electronic component such as a CPU 124 is mounted on the printed circuit board 120 surrounded by the through holes 120.

Referring to FIGS. 4–7, in assembly, the heat sink 100 is placed on the CPU 124 with the through holes 108 thereof aligned with the respective through holes 122 of the printed circuit board 120. Four locking devices 10 are placed on the base 102 of the heat sink 100. The first hooks 26, 64 of the first and second locking members 20, 60 travel through the corresponding through holes 108, 122 of the heat sink 100 and the printed circuit board 120. The pressing blocks 42 of the first locking members 20 rest on the base 102 of the heat sink 100. The handle 84 of the operating members 80 are pressed downwardly until the projections 92 thereof are retained in the retaining holes 39 of the first locking members 20. The operating members 80 pivot about the pivots 90 received in the holes 36 of the first locking members 20. The second locking members 60 are drived to move upwardly by the connecting portions 82 accordingly. The second hooks 64 of the second locking members 60 move upwardly in a vertical direction. The second wedge-shaped bars 66 move upwardly along the corresponding first wedge-shaped bars 28 to drive the first and second locking members 20, 60 to move away each other in a horizontal direction. The first and second hooks 26, 64 therefore move to engage with the bottom face of the printed circuit board 120. Thus, the pressing blocks 42 of the first locking members 20 press the heat sink 100 downwardly and the first and second hooks 26, 64 engage below the printed circuit board 120, whereby the locking devices 10 firmly mounts the heat sink 100 to the CPU 124.

In disassembly, the handles 84 of the operating members 80 are upwardly pulled to release the projections 92 from the retaining holes 39. The connecting portions 82 are pivoted downwardly about the pivots 90. The second locking members 60 are drived to move downwardly by the connecting portions 82. The second wedge-shaped bars 66 move downwardly along the corresponding first wedge-shaped bars 28 to cause the first and second locking members 20, 60 to move toward each other in the horizontal direction. The first and second hooks 26, 64 are thereof disengaged from the bottom face of the printed circuit board 120. After that, the locking devices 10 are readily detached from the printed circuit board 120.

In the preferred embodiment, the first wedge-shaped bar 28 of the first locking member 20 and the second wedge-shaped bar 66 of the second locking member 60 constitute an actuating structure. When the second locking member 60 move upwardly relative to the first locking member 20 in the vertical direction the actuating structure drives the second locking member 60 and the first locking member 20 to move away from each other in the horizontal direction. When the second locking member 60 move downwardly relative to the first locking member 20 in the vertical direction the actuating structure allows the second locking member 60 and the first locking member 20 to move toward each other in the horizontal direction.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A locking device for mounting a heat sink to an electronic component mounted on a circuit board, comprising:
   a first locking member;
   an operating member pivotably connected to the first locking member;
   a second locking member pivotably connected to the operating member; and
   an actuating structure formed between the first and second locking members; wherein
   the operating member is pivotable about the first locking member to drive the second locking member to move relative to the first locking member in a first direction which results in the actuating structure simultaneously driving the second locking member to move relative to the first locking member in a second direction which is perpendicular to the first direction.

2. The locking device as claimed in claim 1, wherein the actuating structure comprises first and second wedge-shaped bars formed in the first and second locking members respectively.

3. The locking device as claimed in claim 2, wherein the first locking member comprises a semi-cylindrical body having a planar face and a circumferential face and a head formed at the top of the body, the first wedge-shaped bar being formed on the planar face.

4. The locking device as claimed in claim 3, wherein the first locking member further comprises a first hook formed at the bottom of the body and adapted for engaging with the circuit board.

5. The locking device as claimed in claim 4, wherein the first locking member further comprises a block formed at the circumferential face of the body adapted for pressing the heat sink toward the circuit board.

6. The locking device as claimed in claim 3, wherein the head comprises a bottom wall from which the body extends downwardly, and a pair of side walls.

7. The locking device as claimed in claim 6, wherein the operating member comprises a connecting portion having a pair of pivots pivotably received in holes defined in the side walls of the head, and a handle extending from the connecting portion.

8. The locking device as claimed in claim 7, wherein the handle comprises a pair of projections formed on opposite sides thereof and the side walls define a pair of retaining holes for retaining the projections of the handle therein.

9. The locking device as claimed in claim 7, wherein bottom wall of the head defines an opening, and the second locking member travels through the opening to pivotly connect to the connecting portion.

10. The locking device as claimed in claim 9, wherein the second locking member forms a protrusion at the top end thereof, and the connecting portion defines a cutout opposing the handle and receiving the protrusion therein.

11. The locking device as claimed in claim 10, wherein the protrusion forms a pair of pivots on opposite sides thereof and the connecting portion defines a pair of holes receiving the pivots of the protrusions therein.

12. A combination comprising:
a circuit board with an electronic component mounted thereon;
a heat sink placed on the electronic component; and
a locking device for mounting the heat sink on the electronic component, the locking device comprising:
first locking member extending through the heat sink and the circuit board and having a block resting on the heat sink and a first hook located below the circuit board;
an operating member pivotably connected to the first locking member; and
a second locking member pivotably connected to the operating member and extending through the heat sink and the circuit board, the second locking member comprising a second hook located below the circuit board;
wherein the operating member is pivotable about the first locking member in a first direction to drive the second locking member to move relative to the first locking member in a second direction which results in the first and second locking members moving away from each other in a third direction to thereby cause the first and second hooks to engage with the circuit board, the second direction being perpendicular to the circuit board and the third direction being parallel to the circuit board.

13. The combination as claimed in claim 12, wherein the operating member is pivotable about the first locking member in a direction opposing the first direction to drive the second locking member to move in a direction opposing the second direction which results in the first and second locking members moving toward each other in the third direction to thereby disengage the first and second hooks from the circuit board.

14. The combination as claimed in claim 13, wherein a pair of first and second wedge-shaped bars is formed in the first and second locking members respectively, and the second wedge-shaped bar is moveable along the first wedge-shaped bar which results in the first and second locking members moving away from each other or toward each other.

15. The combination as claimed in claim 14, wherein the operating member comprises a connecting portion, one end of the connecting portion being pivotably connected to the first locking member, the other end of the connecting portion being pivotably connected to the second locking member.

16. The combination as claimed in claim 15, wherein the first locking member comprises a body on which the first wedge-shaped bar is formed, and a head defining an opening through which the second locking member travels to connect with the operating member.

17. A locking device for mounting a heat sink to an electronic component mounted on a circuit board, comprising:
a first locking member extending from a first receiving portion of said heat sink to a second receiving portion of said circuit board, a restriction mechanism formed on said first locking member so as to restrict relative movement of said heat sink and said electronic component;
an operating member;
a second locking member connected to said operating member and movable within at least one of said first and second receiving portions in an operation of said operation member; and
each of said first and second locking members having partially engagement with said at least one of said first and second receiving portions so as to drive said restriction mechanism into a restriction working status thereof, said engagement working as a result of predetermined movement of said connected operating member and second locking member.

18. The locking device as claimed in claim 17, wherein said first and second locking members are engagable with each other and each of said first and second locking members has a wedge-shaped bar formed on an engaging face thereof.

19. The locking device as claimed in claim 17, wherein said restriction mechanism works as a result that said first locking member fully occupies both of said first and second receiving portions incorporating with said second locking member.

20. The locking device as claimed in claim 17, wherein said restriction mechanism comprises a hook formed at one end of said first locking member and a pressing block formed on a circumferential face of said first locking member.

* * * * *